(12) United States Patent
Yu (10) Patent No.: US 6,937,687 B2
(45) Date of Patent: Aug. 30, 2005

(54) BI-DIRECTIONAL SHIFT REGISTER CONTROL CIRCUIT

(75) Inventor: Jian-Shen Yu, Hsinchu (TW)

(73) Assignee: AU Optronics Corporation, (TW)

( * ) Notice: Subject to any disclaimer, the term of this patent is extended or adjusted under 35 U.S.C. 154(b) by 0 days.

(21) Appl. No.: 10/689,885

(22) Filed: Oct. 21, 2003

(65) Prior Publication Data

US 2005/0084059 A1   Apr. 21, 2005

(51) Int. Cl.[7] .................................................. G11C 19/00
(52) U.S. Cl. ............................ 377/69; 345/99; 345/100
(58) Field of Search ............................. 377/69; 345/99, 345/100

(56) References Cited

U.S. PATENT DOCUMENTS 5,894,296 A    4/1999   Maekawa 6,061,417 A *  5/2000   Kelem ........................ 377/26

* cited by examiner

Primary Examiner—Margaret R. Wambach
(74) Attorney, Agent, or Firm—Duane Morris LLP (57) ABSTRACT

A bi-directional shift register circuit comprising, a plurality of shift register stages, each having an input and an output terminal, and a bi-directional shift controller circuit associated with each of said shift register stages is disclosed. The bi-directional shift controller circuit comprises a first input connected to a output terminal of a first shift register stage and a second input connected to a output terminal of a second shift register stage. Means to apply a first and a second control voltage, wherein said first and second control voltage are different, and a combinatorial circuit responsive to said first and second control voltages to apply an indication of an input received from either said first shift register or said second shift register to said corresponding shift register input terminal. The combinatorial circuit configuration is that of a NOR gate or a NAND gate.

30 Claims, 6 Drawing Sheets

BI-DIRECTIONAL SHIFT REGISTER CONTROL CIRCUIT

FIELD OF THE INVENTION

This application is related to the field of electronic shift register circuits and more specifically to a bi-directional shift register control circuit.

BACKGROUND

The use of bi-directional shift register stages for drive circuits in liquid crystal displays (LCD) to allow a forward or a reverse display image. By causing the image to be scanned in one direction a forward, normal or non-reverse image may be displayed. However, when the image is scanned in a second direction, a reversed image may be displayed. U.S. Pat. No. 5,894,296, entitled "Bidirectional Signal Transmission Network and Bidirectional Signal Transfer Shift Register," issued Apr. 13, 1999, to Maekawa, teaches the use of bidirectional shift register control circuits in the LCD displays. In this circuit, the input and output terminals of the shift register are connected in a manner to construct a multi-stage structure, having a forward route gate element interposed in a connection between the output terminals.

Figure 1A:
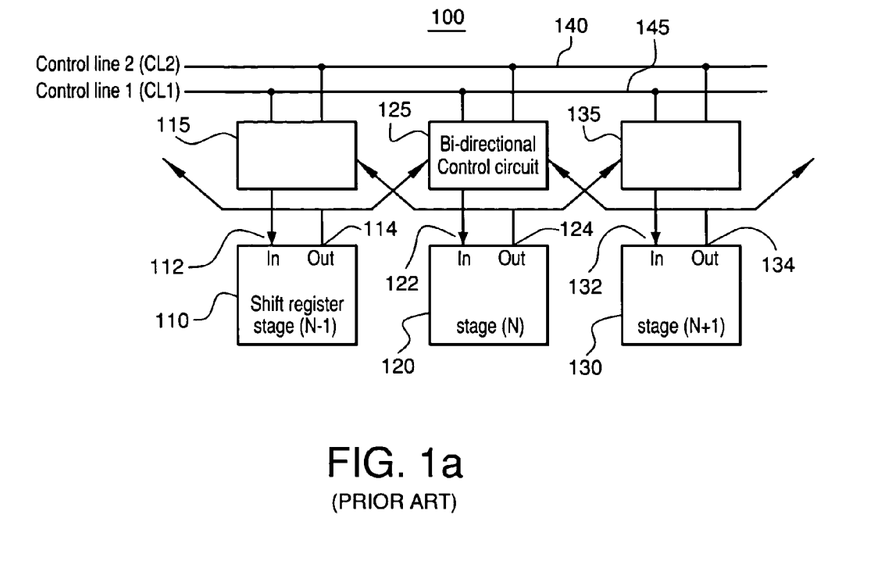
FIG. 1a illustrates a conventional bi-directional shift register circuit.

FIG. 1a illustrates an exemplary conventional bi-directional shift register and control circuit. In this illustrative example, three shift register stages, represented as 110, 120, and 130, are shown serially connected through control circuits 115, 125, and 135, respectively. Shift registers stages 110, 120 and 130 conventionally are referred to, and referred to herein, as the (N−1), (N) and (N+1) stages of shift register circuit 100. This generalization of shift register 100 into (N−1), (N) and (N+1) elements is terminology recognized by those skilled in the art in that the operation of shift registers is performed with regard to adjacent register elements. The generalization of shift register 100 is further appropriate as it would be understood that any number of registers may be electrically connected, physically or logically, to create a shifting device of any size.

Each register further includes an input terminal and an output terminal. Input terminals for the three illustrated register stages are denoted as 112, 122, and 132, respectively, while the output terminals are denoted as 114, 124, and 134, respectively. Control circuits 115, 125 and 135 are electrically connected to an input terminal of a corresponding register stage, whereas the output terminal of each of the register stages is electrically connected to an adjacent bi-directional control circuit. Hence, the output terminal 124 of register stage 120 provides an input to control circuits 115 and 135, while output terminals 114 and 134 of shift registers 110 and 130, respectively, provide input to control circuit 125 and not shown adjacent register stages.

Control lines $CL_1$ 145 and $CL_2$ 140 are used to set control circuits 115, 125, and 135 in a manner to direct the data in the shift register to be shifted in a forward or reverse direction. Typically control lines $CL_1$ 145 and $CL_2$ 140 are set to different values. When $CL_1$ 145 is set to a high level, $CL_2$ 140 is set to a low level to operate in a first direction and reversed operate in second direction.

Figure 1B:
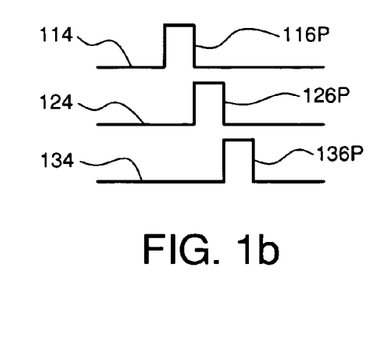
Figure 1C:
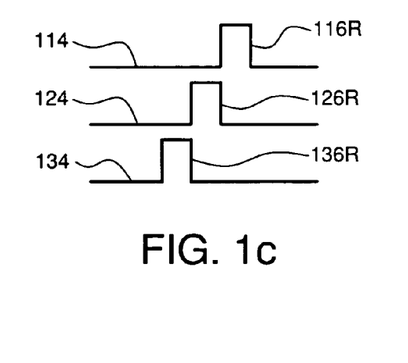

FIGS. 1b and 1c illustrate forward and reverse timing sequences of the shift register 100 shown in FIG. 1a. Referring to FIG. 1a, a pulse 116p output on output terminal 114 is provided as an input to control circuit 125, which is further provided to input terminal 122 of shift register stage 120. Shift register stage 120 then provides pulse 126p from output terminal 124 to input of control circuit 135. Control circuit 135 provides an input voltage to shift register 130 through input terminal 132. Shift register 130 then provides pulse 136p at output terminal 134. This progressive shifting of an initial pulse in a forward, i.e., "p," direction continues for each of the stages in the shift register device. FIG. 1c illustrates a pulse shifting sequence in a reverse, i.e., "r," direction for the shift register shown in FIG. 1a. In this case, pulse 136r on output terminal 134 is input to control circuit 125, which then provides an input to shift register stage 120. Shift register stage 120 generates pulse 126r on corresponding output line 124 that is applied as an input to control circuit 115. The process is repeated for each shift register stage in the shifting device.

Figure 2:
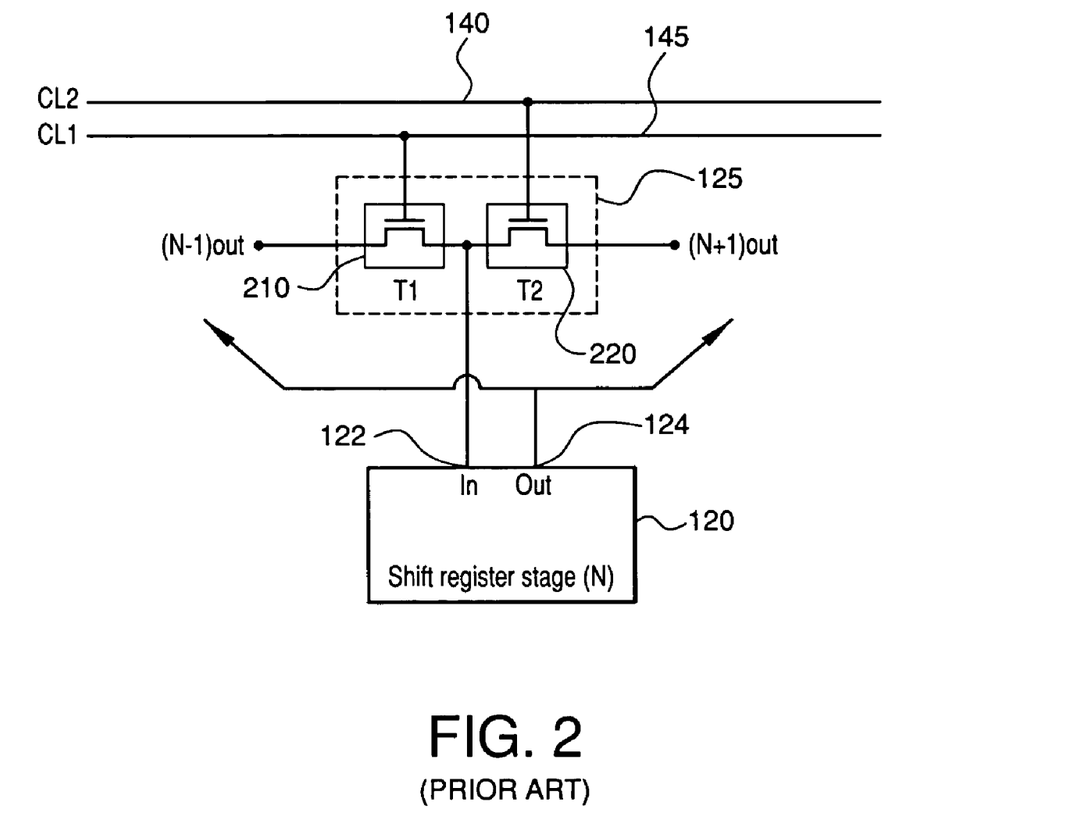
FIG. 2 illustrates a conventional bi-directional shift register control circuit.

FIG. 2 illustrates a conventional control circuit representative of an $N^{th}$ register stage, for example, control circuit 125 and shift register stage 120. Within control circuit 125 are switches 210 and 220 that are operable to direct either the output of the N−1 stage, i.e., 116p, or the (N+1) stage, i.e., 136r, to input 122 of shift register stage 120. In this illustrated case, switches 210 and 220 are represented as n-type Field Effect Transistors (FETs). Control lines 140 and 145 are electrically connected to switches 220 and 210, respectively. In this case, when a high signal, e.g., $V_{dd}$, is applied to control line 145 and a low signal, e.g., $V_{ss}$, is applied to control line 140, switch 210 is closed and switch 220 remains open. An input from an (N−1) stage, e.g., pulse 116p, is provided to the input of shift register stage 120 and data is shifted from the (N−1) stage to an $N^{th}$ stage. Alternatively, when a high signal is applied to control line 140 and a low signal is applied to control line 145, switch 210 remains open and switch 220 is closed. In this case, an input from the (N+1) stage, e.g., 136r, is provided to the input of shift register stage 120 and data is reverse shifted from the (N+1) stage to an $N^{th}$ stage.

A problem with the conventional implementation is that it may suffer from a gate element leakage. For example, if gate element 220 has a sufficient voltage leakage between its source and drain terminals, i.e., it cannot be sufficiently turned off by the control signal on CL2, that under positive forward shifting operation with CL2 at low level, for example, the pulsed signal voltage '(N+1) out' may leak into the input terminal 122 of the electrically adjacent $N^{th}$ shift register stage and introduce an error.

Hence, a shift register control circuit that allows for a complete turnoff of the non-conducting transistors is desirable.

SUMMARY

A bi-directional shift register circuit comprising, a plurality of shift register stages, each having an input and an output terminal, and a bi-directional shift controller circuit associated with each of said shift register stages is disclosed. The bi-directional shift controller circuit comprises a first input connected to the output terminal of a first shift register stage and a second input connected to the output terminal of a second shift register stage. Means to apply a first and a second control voltage, wherein said first and second control voltage are different, and a combinatorial circuit responsive to said first and second control voltages to apply an indication of an input received from either said first shift register stage or said second shift register stage to a corresponding shift register input terminal. The combinatorial circuit configuration is that of a NOR gate or a NAND gate.

BRIEF DESCRIPTION OF THE DRAWINGS

FIGS. 1b and 1c illustrate timing diagrams of the bi-directional shift register shown in FIG. 1a;

FIGS. 3b and 3c illustrate timing diagrams of the bi-directional shift register control circuit shown in FIG. 3a;

FIGS. 4b and 4c illustrate timing diagrams of the bi-directional shift register control circuit shown in FIG. 4a.

It is to be understood that these drawings are solely for purposes of illustrating the concepts of the invention and are not intended as a definition of the limits of the invention. The embodiments shown in FIGS. 3a through 4c and described in the accompanying detailed description are to be used as illustrative embodiments and should not be construed as the only manner of practicing the invention. Also, the same reference numerals, possibly supplemented with reference characters where appropriate, have been used to identify similar elements.

DETAILED DESCRIPTION OF THE INVENTION

Figure 3A:
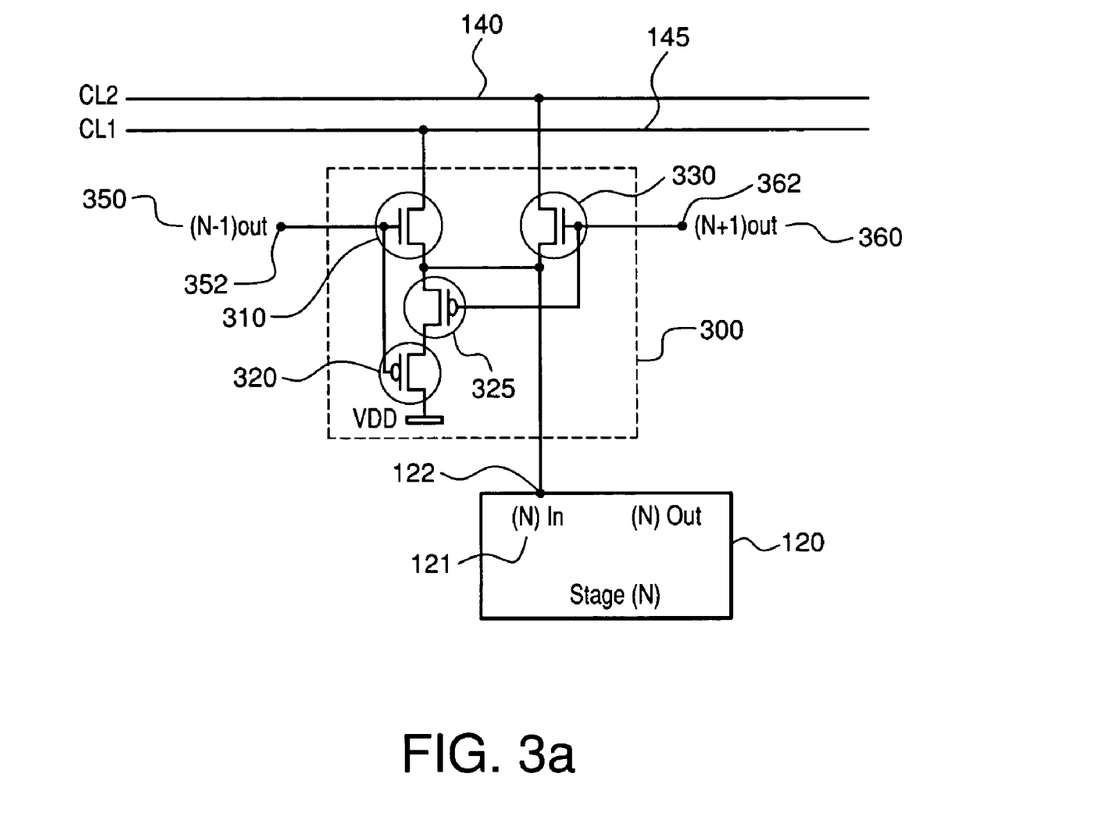
FIG. 3a illustrates a first exemplary embodiment of a bi-directional shift register control circuit in accordance with one aspect of the invention.

FIG. 3a illustrates a first exemplary embodiment 300 of the present invention. In this first embodiment, shown as a NOR gate combinational logic circuit, first transistor 310 is electrically connected to a first control line, $CL_1$ 145, and a second transistor 325. Second transistor 325 is electrically connected between first transistor 310 and third transistor 320. Third transistor 320 is electrically connected to a known voltage, in this case, $V_{dd}$. A fourth transistor 330 is electrically connected between a second control line $CL_2$ 140 and an input terminal 122 of shift register stage 120 through the drain terminal. Drain terminal of the first transistor 310 is further connected to the drain terminal of the fourth transistor 330 for subsequent connection to the input terminal 122 of shift register stage 120. The gate terminals of the first and third transistors 310, 320 are connected to an electrical means that enables a voltage '(N−1) out' 350 to be concurrently applied thereto. Similarly the gate terminals of the second and fourth transistors 325, 330 are connected to a means that enables a voltage '(N+1) out' 360 to be concurrently applied thereto.

In this exemplary embodiment, an output of an (N−1) stage, referred to as voltage '(N−1)out', 350, is provided to the gates terminals of n-type transistor 310 and to p-type transistor 320 at terminal 352. Similarly, an output of a (N+1) stage, referred to as voltage '(N+1) out' 360, is provided to the gate terminals of n-type transistor 330 and to p-type transistor 325 at terminal 362.

Source terminals of n-type transistor 310 and transistor 330 are electrically connected to control line $CL_1$ 145 and $CL_2$ 140, respectively. In the present invention, $CL_1$ 145 and $CL_2$ 140 are set to different voltage levels to operate NOR circuit 300 as either a bi-directional forward shifting control circuit or a bi-directional reverse shifting control circuit.

Figure 3B:
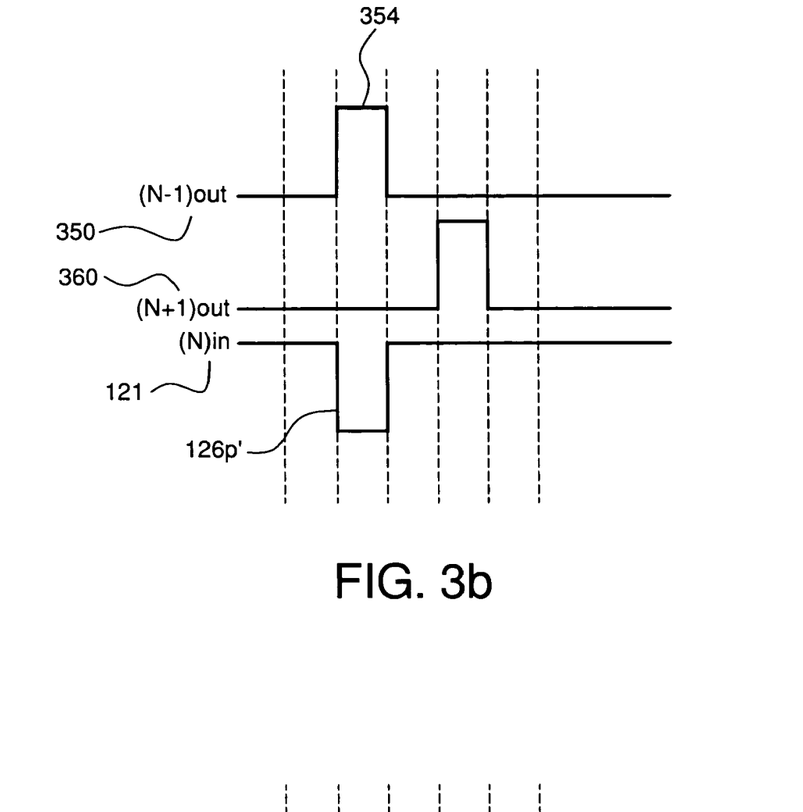

FIG. 3b illustrates a timing sequence for operation of NOR circuit 300 as a bi-directional forward shifting control circuit in accordance with the principles of the invention. In this case, control line $CL_1$ 145 is set to a low voltage, $V_{ss}$, and control line $CL_2$ 140 set to a high voltage, $V_{dd}$. When the voltages of both '(N−1) out' 350, and '(N+1) out' 360, are at low level, n-type transistors 310 and 330 are turned off while the p-type transistors 320 and 325 are turned on. Voltage '(N) in' 121 is, thus, set at a high voltage, $V_{dd}$, as the only the path between input terminal 122 of shift register stage 120 and the source terminal of transistor 320 is conducting.

However, when voltage '(N−1) out' 350 is at high level, represented as pulse 354 and voltage '(N+1) out' 360 is at low level, n-type transistor 310 and the p-type transistor 325 are turned on while n-type transistor 330 and the p-type transistor 320 are turned off. In this case, only the path between terminal 122 and the source terminal of transistor 310 is conducting. Thus, voltage '(N) in' 121 at input terminal 122 is at a level of that of $CL_1$ 145, which is $V_{ss}$. As voltage '(N) in' 121 is at a low voltage, represented as pulse 126p', it is inverted with regard to input pulse 354. On the other hand, when voltage '(N−1) out' 350 is at low level and voltage '(N+1) out' 360 is at high level, the p-type transistor 320 is turned on while n-type transistors 330 and 310 and p-type transistor 325 are turned off. In this case, the drain of transistor 330 is forced to a high level by its gate/drain capacitance and only the path between input terminal 122 of shift register stage 120 and the drain terminal of transistor 330 is conducting. Thus, the voltage '(N) in' 121 at input terminal 122 remains substantially at a high level, i.e., $V_{dd}$. The pulsed signal '(N+1) out' is blocked away from triggering shift register stage (N) by the invented bi-directional circuit under forward shifting operation.

Referring now to FIG. 1a, to explain the time shift in voltage '(N+1) out' 360, when shift register stage (N) 120 receives a pulsed signal at its input terminal 122, it will generate an output pulse '(N) out' with a timing shift of a clock width similar to that shown in FIG. 1b as 126p. The output pulse '(N) out' is fed to bi-directional circuits 115 and 135. Under forward shifting operation, bi-directional circuit 115 does not response to '(N) out' while bi-directional circuit 135 will generate a pulsed signal from '(N) out' in order to trigger next shift register stage (N+1). Similarly, after stage (N+1) receives a pulsed signal at its input terminal 132, it will generate a shifted output pulse '(N+1) out', similar to that shown in FIG. 1b as 136p. The pulse of '(N+1) out' is provided to bi-directional circuit 125 and bi-directional circuit of subsequent stage (N+2) (not shown in FIG. 1a). As the process continuing, pulses are generated and sequentially shifted.

Figure 3C:
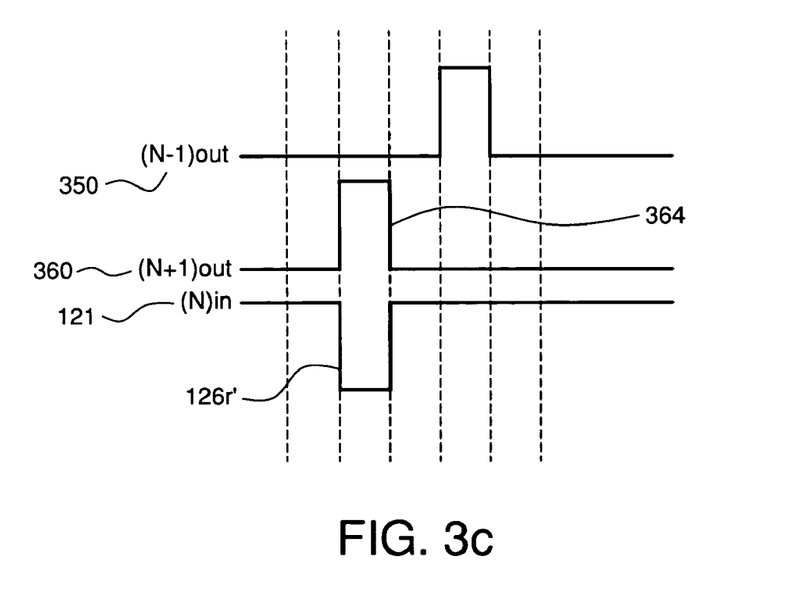

Operation of NOR circuit 300 as a bi-directional reverse shifting control circuit is more clearly shown with reference to FIG. 3c. FIG. 3c illustrates a timing sequence for operation of NOR circuit 300 as a bi-directional reverse shifting control circuit in accordance with the principles of the invention. In this case, control line $CL_1$ 145 is set to a high voltage, $V_{dd}$, and control line $CL_2$ 140 set to a low voltage, $V_{ss}$. When the voltages of both '(N−1) out' 350, and '(N+1) out' 360, are at a low level, n-type transistors 330 and 310 are turned off, while p-type transistors 320 and 325 are turned on. Voltage '(N) in' 121 is, thus, set at a high voltage, $V_{dd}$, as the only the path between input terminal 122 of shift register stage 120 and the source terminal of transistor 320 is conducting.

When the voltage '(N−1) out' 350 is at low level and voltage '(N+1) out' 360 is at high level, represented as pulse 364 the n-type transistor 330 and the p-type transistor 320 are turned on while the n-type transistor 310 and the p-type transistor 325 are turned off. In this case, the path between terminal 122 and the source terminal of transistor 330 is conducting so that the voltage (N) in, represented as pulse 124, is at a level of that of $CL_2$ 140, which is $V_{ss}$.

Figure 4A:
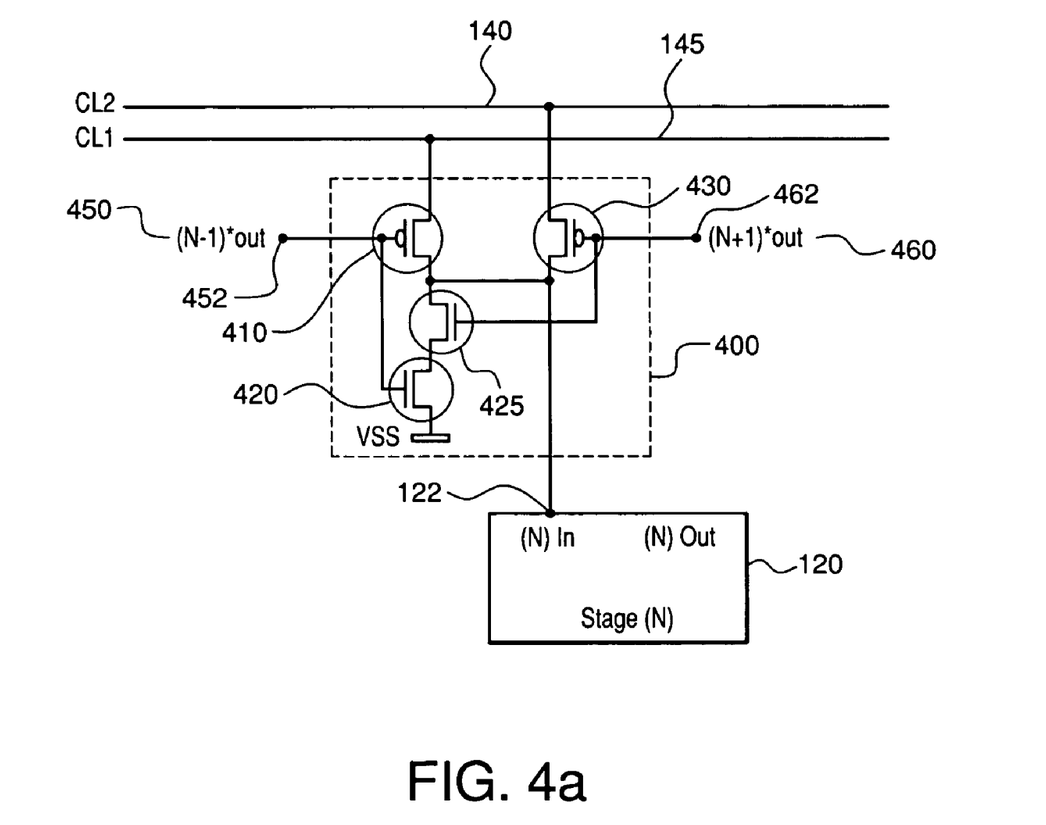
FIG. 4a illustrates a second exemplary embodiment of a bi-directional shift register control circuit in accordance with one aspect of the invention.

FIG. 4a illustrates a second exemplary embodiment 400 of the present invention. In this second embodiment, shown as a NAND gate combinational logic circuit, the configuration is the same as that described with regard to FIG. 3a and need not be repeated. In this embodiment, p-type transistors replace the n-type transistors and n-type transistors replace the p-type transistors shown in FIG. 3a. Furthermore, the known voltage applied to third transistor 420 is set at a low voltage, $V_{ss}$.

In operation of this second embodiment of the invention, the inverse of the voltage output of an (N−1) stage, referred to as '(N−1)*out' 450, is provided to p-type transistor 410 and concurrently applied to n-type transistor 420 through terminal 452. Similarly, the inverse or inverted voltage output of an (N+1) stage, referred to as '(N+1)*out' 460, is provided concurrently to p-type transistor 430 and to n-type transistor 425 through terminal 462. Furthermore, source terminals of the p-type transistor 410 and transistor 430 are electrically connected to control line $CL_1$ 145 and $CL_2$ 140, respectively. As previously discussed, in the present invention $CL_1$ 145 and $CL_2$ 140 are set to different voltage levels in order to operate the NAND circuit as a bi-directional forward or reverse shifting control circuit.

Figure 4B:
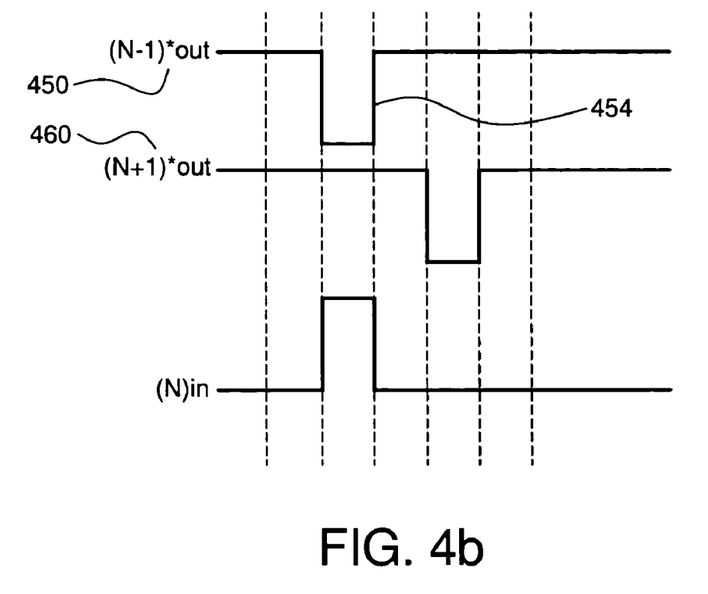

FIG. 4b illustrates a timing sequence for operation of NAND circuit 400 as a bi-directional forward shifting control circuit in accordance with the principles of the invention. In this case, control line $CL_1$ 145 is set to a high voltage, $V_{dd}$, and control line $CL_2$ 140 set to a low voltage, $V_{ss}$. When the voltages of both '(N−1)*out' 450, and '(N+1)*out' 460, are at high level, p-type transistors 410 and 430 are turned off while the n-type transistors 420 and 425 are turned on. Voltage '(N) in' 121 is, thus, set at a low voltage, $V_{ss}$, as the only the path between input terminal 122 of shift register stage 120 and the source terminal of transistor 420 is conducting.

However, when voltage '(N−1)*out' 450 is at low level, represented as inverted pulse 454, and voltage '(N+1)*out' out 460 is at high level p-type transistor 410 and the n-type transistor 425 are turned on while the p-type transistor 430 and the n-type transistor 420 are turned off. Voltage '(N) in' 121 is at a level of that of $CL_1$ 145 which is $V_{dd}$ as only the path between input terminal 122 of shift register stage 120 and source terminal of transistor 410 is conducting.

Figure 4C:
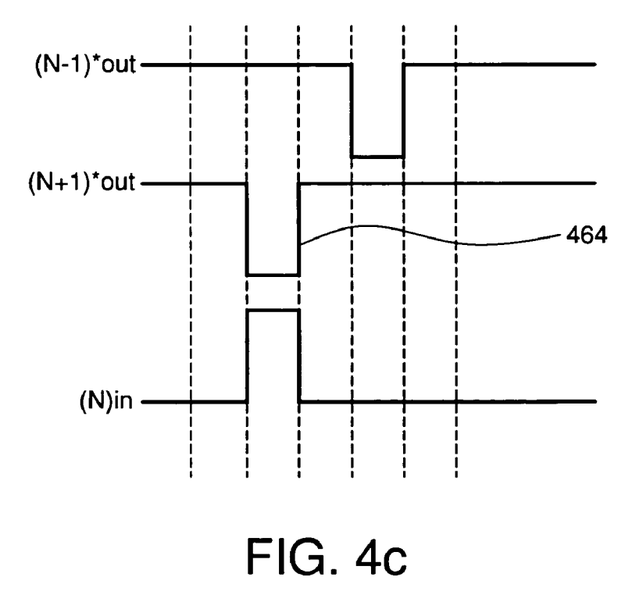

FIG. 4c illustrates a timing sequence for operation of NAND circuit 400 as a bi-directional reverse shifting control circuit in accordance with the principles of the invention. In this case, control line $CL_1$ 145 is set to a low voltage, $V_{ss}$, and control line $CL_2$ 140 set to a high voltage, $V_{dd}$. When '(N−1)*out' 450 is at high level and '(N+1)*out' 460 is at low level, represented as inverse pulse 464, p-type transistor 430 and the n-type transistor 420 are turned on while the p-type transistor 410 and the n-type transistor 425 are turned off. In this case, voltage '(N) in' 121 is at a level of that of $CL_2$ 144, i.e., $V_{dd}$, as only the path between input terminal 122 of shift register stage 120 and the source terminal of transistor 430 is conducting.

When the voltages of both '(N−1)*out' 450, and '(N+1)*out' 460, are at high level, p-type transistors 410 and 430 are turned off while the n-type transistors 420 and 425 are turned on. Voltage (N) in 121 is, thus, set at a low voltage, $V_{ss}$, as only the path between node input terminal 122 of shift register stage 120 and the source terminal of transistor 420 is conducting.

Further, when voltage '(N+1)*out' 460 is at high level and voltage '(N−1)*out' 450 transitions from a high level to a low level, represented as inverse pulse 454, n-type transistor 425 is turned on while the n-type transistor 420 and the p-type transistors 430 and 410 are turned off. In this case, the gate to drain capacitance of transistor 410 forces the drain of transistor 410 to a low state when (N−1)*transitions from a high level to a low level. With the drain of transistor 410 at a low state, the path between input terminal 122 of shift register stage 120 and the drain terminal of transistor 410 is conducting so that the voltage '(N) in' 121 is substantially at a level of that of $V_{ss}$. In this case, voltage (N) in 121 remains at its normally low level state.

From the above operation steps, the input triggering signal voltage '(N) in' of stage (N) is provided by the output pulse of the $(N+1)^{th}$ stage and not from that of $(N-1)^{th}$ stage, so reverse shifting occurs.

While there has been shown, described, and pointed out fundamental novel features of the present invention as applied to preferred embodiments thereof, it will be understood that various omissions and substitutions and changes in the apparatus described, in the form and details of the devices disclosed, and in their operation, may be made by those skilled in the art without departing from the spirit of the present invention. For example, although the present invention has been shown using Field-Effect Transistors (FETs), one skilled in the art would recognize that other types of transistors, such as Floating Gate Transistors may be used without altering the scope of the invention disclosed herein.

It is expressly intended that all combinations of those elements that perform substantially the same function in substantially the same way to achieve the same results are within the scope of the invention. Substitutions of elements from one described embodiment to another are also fully intended and contemplated.

What is claimed is:

1. A bi-directional shift controller comprising:
   a first control line with a first voltage;
   a second control line with a second voltage;
   a plurality of transistors serially connected between said first control line and a third voltage, wherein a source terminal of a first transistor is electrically connected to said first control line and a drain terminal of said first transistor is electrically connected to a second transistor, and a source terminal of a third transistor is connected to said third voltage;
   a fourth transistor connected between said second control line and an input terminal of a shift register stage, the drain terminal of said first transistor further electrically connected to said input terminal of said shift register stage;
   means to apply a first output voltage from previous shift register stage concurrently to gate terminals of each of said first and third transistors; and
   means to apply a second output voltage from next shift register stage concurrently to gate terminals of each of said second and fourth transistors.

2. The bi-directional shift controller as recited in claim 1, further comprising:
   means to invert said first and second voltages.

3. The bi-directional shift controller as recited in claim 1, wherein said first, second, third, and fourth transistors provide a combinatorial logic operable as a NOR gate.

4. The bi-directional shift controller as recited in claim 3, wherein said first and fourth transistors are n-type and said second and third transistors are p-type.

5. The bi-directional shift controller as recited in claim 3, wherein said third voltage is $V_{dd}$.

6. The bi-directional shift controller as recited in claim 5, wherein said first control line voltage is $V_{dd}$ and second control line voltage is $V_{ss}$, wherein $V_{dd}$ is higher than $V_{ss}$.

7. The bi-directional shift controller as recited in claim 5, wherein said first control line voltage is $V_{ss}$ and second control line voltage is $V_{dd}$, wherein $V_{dd}$ is higher than $V_{ss}$.

8. The bi-directional shift controller as recited in claim 1, wherein said first, second, third, and fourth transistors provide a combinatorial logic operable as a NAND gate.

9. The bi-directional shift controller as recited in claim 8, wherein said first and fourth transistors are p-type and said second and third transistors are n-type.

10. The bi-directional shift controller as recited in claim 8, wherein said third voltage is $V_{ss}$.

11. The bi-directional shift controller as recited in claim 10, wherein said first control line voltage is $V_{dd}$ and second control line voltage is $V_{ss}$.

12. The bi-directional shift controller as recited in claim 10, wherein said first control line voltage is $V_{ss}$ and second control line voltage is $V_{dd}$.

13. The bi-directional shift controller as recited in claim 1, wherein said transistors are selected from the group consisting of field effect transistors and floating gate transistors.

14. The bi-directional shift controller as recited in claim 1, wherein said shift register stages are physically adjacent to said bi-directional controller.

15. The bi-directional shift controller circuit as recited in claim 1, wherein said shift register stages are logically adjacent to said bi-directional controller.

16. A bi-directional shift register circuit comprising:
a first control line with a first voltage;
a second control line with a second voltage;
a plurality of shift register stages, each of the shift register stages having an input terminal and an output terminal, and
a bi-directional shift controller comprising:
  a plurality of transistors serially connected between said first control line and a third voltage, wherein a source terminal of a first transistor is electrically connected to said first control line, and a drain terminal of said first transistor is electrically connected to a second transistor, and a source terminal of a third transistor is connected to said third voltage;
  a fourth transistor connected between said second control line and an input terminal of a shift register stage, the drain terminal of said first transistor further electrically connected to said input terminal of said shift register stage;
  means to apply a first output voltage from previous shift register stage concurrently to gate terminals of each of said first and third transistors; and
  means to apply a second output voltage from next shift register stage concurrently to gate terminals of each of said second and fourth transistors.

17. The bi-directional shift register circuit as recited in claim 16, further comprising:
means to invert voltages on said first and second inputs.

18. The bi-directional shift register circuit as recited in claim 16 wherein said first, second, third, and fourth transistors provide a combinatorial circuit operable as an NOR gate.

19. The bi-directional shift controller as recited in claim 18, wherein said first and fourth transistors are n-type and said second and third transistors are p-type.

20. The bi-directional shift controller circuit as recited in claim 18, wherein said third voltage is $V_{dd}$.

21. The bi-directional shift controller circuit as recited in claim 20, wherein said first control line voltage is $V_{dd}$ and second control line voltage is $V_{ss}$, wherein $V_{dd}$ is higher than $V_{ss}$.

22. The bi-directional shift controller circuit as recited in claim 20, wherein said first control line voltage is $V_{ss}$ and second control line voltage is $V_{dd}$, wherein $V_{dd}$ is higher than $V_{ss}$.

23. The bi-directional shift controller circuit as recited in claim 16, wherein said first, second, third, and fourth transistors provide a combinatorial logic operable as a NAND gate.

24. The bi-directional shift controller circuit as recited in claim 23, wherein said first and fourth transistors are p-type and said second and third transistors are n-type.

25. The bi-directional shift controller circuit as recited in claim 23, wherein said third voltage is $V_{ss}$.

26. The bi-directional shift controller circuit as recited in claim 25, wherein said first control line voltage is $V_{dd}$ and second control line voltage is $V_{ss}$.

27. The bi-directional shift controller circuit as recited in claim 25, wherein said first control line voltage is $V_{ss}$ and second control line voltage is $V_{dd}$.

28. The bi-directional shift controller circuit as recited in claim 16, wherein said transistors are selected from the group consisting of field effect transistors and floating gate transistors.

29. The bi-directional shift controller circuit as recited in claim 16, wherein said shift register stages are physically adjacent to said bi-directional controller.

30. The bi-directional shift controller circuit as recited in claim 16, wherein said shift register stages are logically adjacent to said bi-directional controller.

* * * * *